United States Patent

[11] 3,634,738

[72] Inventors Frank A. Leith;
Carl H. Guild, Jr., both of Andover, Mass.

[21] Appl. No. 78,355
[22] Filed Oct. 6, 1970
[45] Patented Jan. 11, 1972

[73] Assignee KEV Electronics Corporation
Wilmington, Mass.

[54] DIODE HAVING A VOLTAGE VARIABLE CAPACITANCE CHARACTERISTIC AND METHOD OF MAKING SAME
10 Claims, 4 Drawing Figs.

[52] U.S. Cl. ........................................................ 317/234, 29/570, 148/1.5, 317/235
[51] Int. Cl. ........................................................ H01l 9/00
[50] Field of Search ........................................... 317/234, 235; 148/1.5

[56] References Cited

UNITED STATES PATENTS

| | | | |
|---|---|---|---|
| 2,842,466 | 7/1958 | Mayer | 148/1.5 |
| 3,293,084 | 12/1966 | McCaldin | 148/1.5 |
| 3,461,361 | 8/1969 | Delivorias | 317/235 |
| 3,483,443 | 12/1969 | Mayer et al. | 317/234 |

*Primary Examiner*—James D. Kallam
*Attorney*—Kenway, Jenney & Hildreth

ABSTRACT: In the method of the present invention, a lightly doped layer of semiconductive material is epitaxially grown on a relatively highly doped substrate so as to provide a relatively sharply defined transition in conductivity between the epitaxial layer and the original substrate material. Further, additional dopant material of the same conductivity type is implanted into the layer by particle bombardment thereby to provide a conductivity profile in which conductivity decreases with depth through the layer substantially down to the essentially uniform conductivity of the original epitaxial material. A dopant providing conductivity of the opposite type is diffused into a relatively shallow portion of the epitaxial layer so as to form a diode junction in the layer. In the diode so formed, the depth of the depletion region varies as a predictable function of the controlled conductivity profile in the epitaxial layer. Since the substrate provides a region of high conductivity just beyond the epitaxial layer, the Q of the device is relatively high.

INVENTORS
FRANK A. LEITH
CARL H. GUILD, JR.
BY Kenway, Jenney & Hildreth
ATTORNEYS

DIODE HAVING A VOLTAGE VARIABLE CAPACITANCE CHARACTERISTIC AND METHOD OF MAKING SAME

BACKGROUND OF THE INVENTION

This invention relates to diodes and to a method of making diodes which have reproducible voltage-variable capacitance characteristics.

As is understood, the capacitance of a semiconductor diode varies as a function of the thickness of the depletion layer formed when the diode is reverse biased. As the thickness of the depletion layer in turn varies as a function of the voltage across the diode, such diodes have found use as variable-reactance tuning devices in various radiofrequency systems. In order to provide useful capacitance ranges, the conductivity profiles of diodes intended for such uses are typically controlled by various adjustments of the manufacturing process, so that the thickness of the depletion region varies as a desired function of the diode voltage. A diode especially designed or tailored for such operation is typically referred to as a varactor or a VVC (voltage-variable capacitor).

While varactor diodes having desirable electrical characteristics have been constructed heretofore, it has typically not been possible to fabricate such diodes in large numbers having exactly reproducible voltage-capacitance characteristics. As a desired use for such voltage-variable capacitance elements is in radiofrequency tuners, e.g., television tuners in which several such diodes having matched electrical characteristics may be used, it has heretofore been necessary to achieve such matching by testing and selection. As is understood, such testing and selection to obtain even two matched components is relatively time consuming and expensive. On the other hand, various tuner designs suitable for TV applications have been proposed which require up to seven matched diodes. Heretofore, the manufacture of such tuners has not been commercially feasible because of the unavailability of large number of diodes having matched electrical characteristics.

Among the several objects of the present invention may be noted the provision of a method of making voltage-variable capacitance diodes having precisely reproducible electrical characteristics; the provision of such a method permitting epitaxial preselection of the desired voltage-capacitance characteristics; the provision of voltage-variable capacitor diodes having a relatively high Q; the provision of such diodes providing a relatively high ratio of capacitance change o total capacitance with a reasonable voltage range; the provision of such diodes which are highly reliable and which are relatively inexpensive. Other objects and features will be in part apparent and in part pointed out hereinafter.

SUMMARY OF THE INVENTION

In the making of voltage of variable capacitance diodes according to the present invention, a semiconductor substrate is provided which is relatively highly doped to provide conductivity of a first type. A relatively lightly doped layer of similar conductivity type is epitaxially grown on the substrate so as to provide a relatively sharply defined transition in conductivity between the epitaxial layer and the original substrate material. A relatively high concentration of a dopant providing conductivity of a second type, complementary to the first type, is then diffused into a relatively shallow portion of the epitaxial layer. Finally, ions of a dopant material providing conductivity of the first type are implanted into the epitaxial layer, through and beyond the shallow portion of opposite conductivity type, thereby to provide, in said layer, a conductivity profile of the first type which decreases with depth through the epitaxial layer, up to the original substrate. At that point, the conductivity increases relatively abruptly. Accordingly, when the shallow portion of second-type conductivity is reverse biased with respect to the balance of the epitaxial layer and the substrate, the thickness of the depletion region thereby produced and the capacitance of the diode vary as precisely predictable functions of the conductivity profile in the epitaxial layer.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
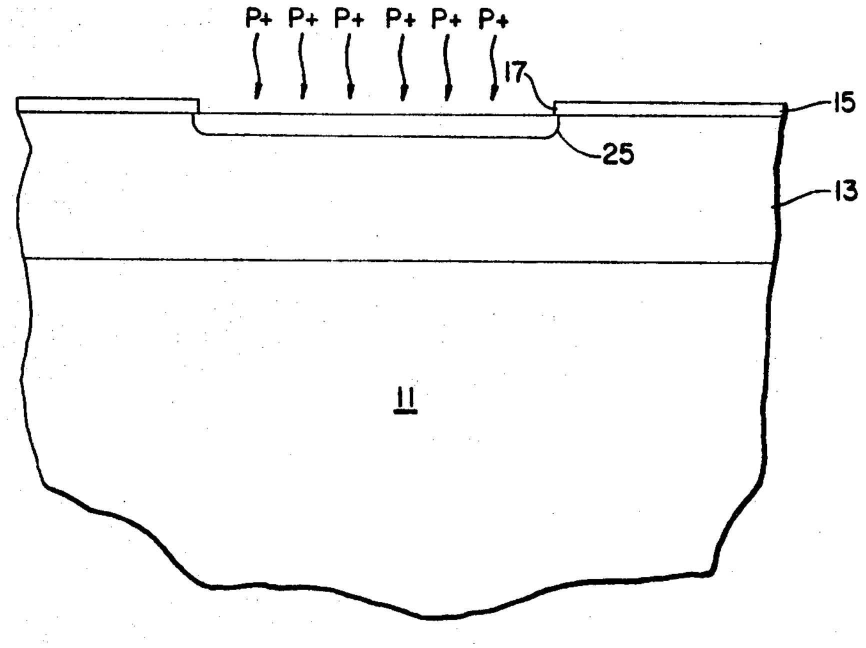
FIG. 1–3 are sectional views of a semiconductor substrate illustrating successive steps in the method of making a diode having a voltage variable capacitance characteristic according to the present invention. In these figures, the vertical scale is greatly exaggerated so that the various semiconductor regions can be distinguished.

Referring now to FIG. 1, construction of a diode in accordance with the present invention starts with a semiconductor substrate 11 which is relatively highly doped to provide conductivity of a first type. In this illustrative example, substrate 11 is a slice of silicon which has been relatively heavily doped with antimony to provide N-type conductivity in the range of 0.008–0.015 ohm-centimeters. On substrate 11 is epitaxially grown a layer 13 of silicon which is relatively lightly doped to provide conductivity of the same type, i.e., N-type conductivity. Preferably, layer 13 is epitaxially grown by decomposing an atmosphere comprising silane ($SiH_4$) rather than the more usual atmosphere of silicon tetrachloride. The advantage of using a silane atmosphere as a source of silicon for the epitaxial growth is that a relatively sharply defined transition in conductivity between the epitaxial layer 13 and the original substrate material 11. When the epitaxial layer is grown in an atmosphere of silicon tetrachloride, there is typically some autodoping caused by the hydrogen chloride byproduct which etches silicon from the substrate which then mixes with the deposited material. This etched silicon from the substrate carries with it dopant material from the more highly doped substrate which then blurs the transition in conductivity between the epitaxial layer and the substrate. With either type of atmosphere there is some diffusion, as is understood, but the silane produces a sharper transition but there is less with the silane process since deposition occurs at a lower temperature.

As is understood, epitaxial growing of a semiconductor layer is typically provided by placing the substrate on a conductive susceptor of "boat" which is then inductively heated, e.g., to 1,050° C. for silane, to decompose an atmosphere which includes a compound of the particular semiconductor material, i.e., silicon. The atmosphere also includes the desired dopant material. In decomposing silane excess hydrogen is provided to cause silicon with the dopant to be deposited on the substrate. The epitaxial layer provided is preferably about 2 microns in thickness. The layer can be grown to a thickness of about 3 microns and then be etched back to 2 microns, which reduces surface contamination or the epitaxial layer may be grown to about 2 microns without etching if surface contamination is avoided.

After the epitaxial layer 13 if formed, its surface is passivated in conventional manner by forming an oxide layer as indicated at 15. Using conventional photoresist techniques, layer 15 is then selectively etched away to provide an opening or window 17 to permit introduction by diffusion of dopant material for forming the diode itself. In the following description, the construction of a single diode is described and only the various mask openings operative in fabricating that diode are mentioned. However, it should be understood that a single silicon substrate will typically produce a large number of semiconductor devices and thus the mask which is for selectively etching the passivation layer 15 will typically comprise a repeated pattern. Dopant material providing P-type conductivity is diffused into a relatively shallow portion of the epitaxial layer. This shallow portion or region is indicated at 25 and, as will be apparent hereinafter, this portion forms the anode of the completed diode. If desired, a guard ring may be formed around the region 25 by a separate, earlier diffusion step. The dopant concentration is the shallow layer 25 is preferably relatively high, e.g., providing conductivity in the order of 0.001 ohm-cm., and a preferred method for providing this diffusion is to diffuse from a boron-saturated glass deposited on the surface as part of the diffusion process. As is understood, the use of a boron-saturated glass permits a relatively high concentration of the dopant to be introduced into a relatively shallow portion of the epitaxial layer. Preferably this diffusion is to a nominal depth of 0.2 microns.

Figure 2:
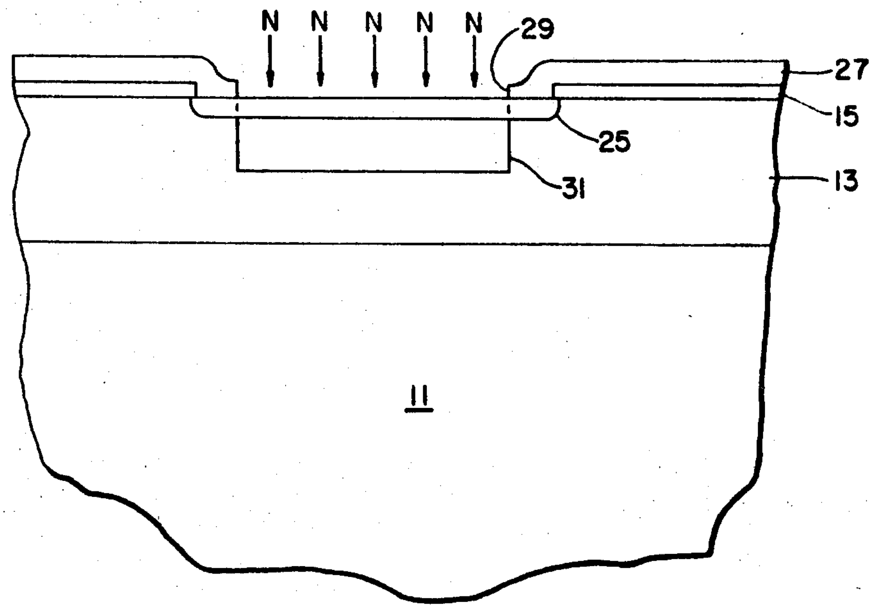

After the region 25 has been formed, masking layer 27 is laid down as illustrated in FIG. 2. Layer 27 is opened, as indicated at 29, by conventional photoresist techniques to provide a window through which ions of an N-type dopant material can be implanted into the epitaxial layer by means of ion bombardment. A suitable masking material for the layer 27 is commercially known Kodak KTFR masking material applied to a thickness of 1 micron. In the particular embodiment being described, phosphorous ions are implanted in the epitaxial layer, the ions having been accelerated to an energy level of about 270–300 kev. The integrated ion beam intensity is preferably about $6\times10^{-7}$ coulombs/cm.$^2$, i.e., about $3.7\times10^{12}$ ions/cm.$^2$ As is understood by those skilled in the art, the process of implanting ions by ion bombardment at a given energy level will cause the concentration of the ions in the matrix material to reach a peak value at a predetermined distance below the surface, the concentration around the peak approximately following a gaussian distribution curve. In the embodiment illustrated, the concentration is about $1.3\times10^{17}$ atoms/cm.$^3$ and occurs at a depth of about 0.32 microns below the surface of the epitaxial layer or about 0.12 microns below the nominal junction between the shallow P-type region 25 and the remaining portions of the epitaxial layer which are of N-type conductivity. This forms a region 31 of somewhat increased N-type conductivity, the increased level being significantly greater than the background conductivity of epitaxial layer to a depth of about 0.7 microns.

Figure 3:
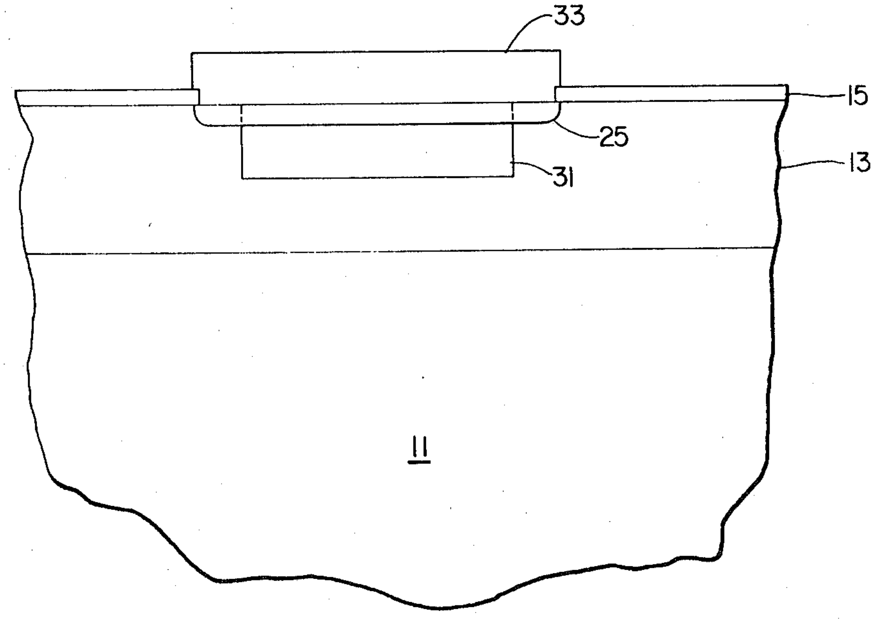

After the implantation process itself is completed, the photoresist is removed and the substrate, together with the epitaxial layer, is heated to annealing temperatures to heal ion bombardment damage and to convert the locations of the implanted dopant ions from interstitial locations to substitutional locations in the silicon matrix. After the substrate has been annealed, an aluminum contact may be applied to the anode region 25 as indicated at 33 in FIG. 3. The diode may then be completed in conventional manner, that is, the substrate 11 may be divided into individual devices and suitable leads or contacts may be applied, the entire device being then put into a suitable package. As these latter steps are conventional and form no part of the present invention, they are not described in detail herein.

Figure 4:
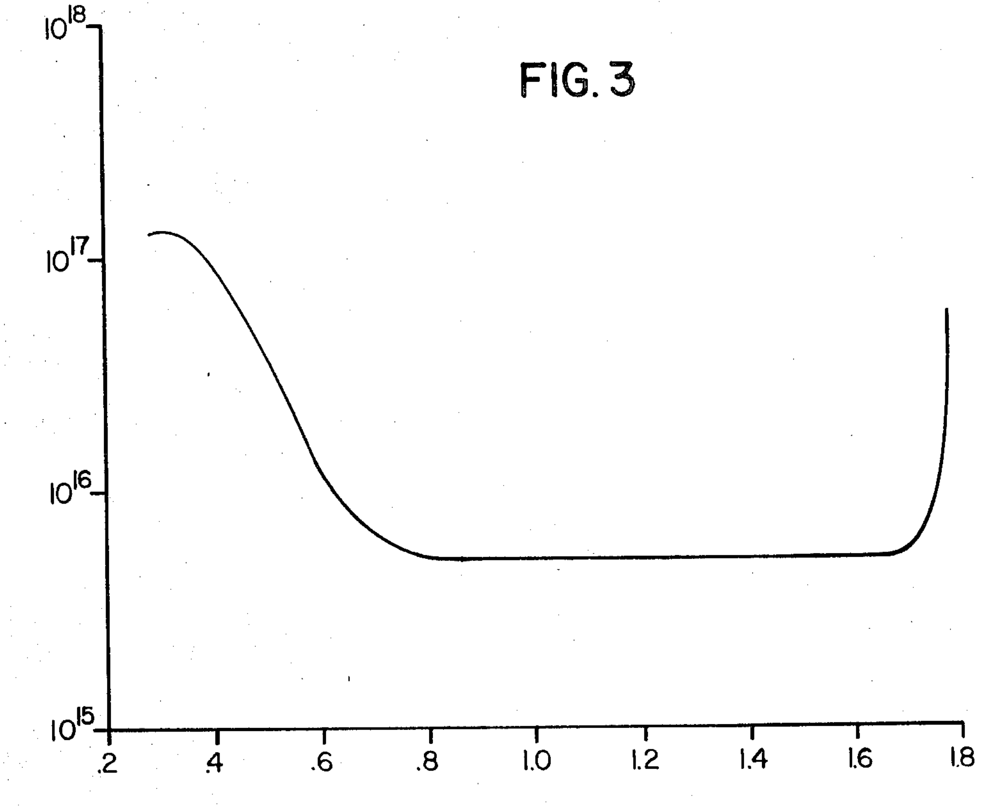
FIG. 4 is a graph representing the distribution of N-type impurities in an epitaxial layer grown on the substrate of FIGS. 1–3.

FIG. 4 is a graph representing the profile or distribution of N-type dopant impurities in the epitaxial layer, dopant concentration being plotted on a logarithmetic scale as a function of depth on a linear scale. As may be seen, this distribution peaks at a depth of about 0.3 microns into the layer, this point being slightly below the PN-junction, the PN-junction being defined as the point at which the concentrations of the P-type and N-type impurities are substantially equal. At the peak, the concentration of N-type impurity ions is about $1.3\times10^{17}$ ions/cm.$^2$ At greater depths the ion distribution decreases progressively, asymptotically approaching the background level determined by the doping level of the epitaxially grown material itself. Finally, at the right of the curve as illustrated, the N-dopant concentration rises relatively abruptly as dopant ions from the highly doped substrate 11 are encountered.

Since the rate at which the depletion layer grows as a function of voltage depends upon the impurity or dopant concentration at the margin or edge of the depletion region, it can be seen that the variation in device capacitance as a function of voltage is itself a function of the impurity concentration profile, i.e., the shape of the curve shown in FIG. 4. In the diode of the present invention, the capacitance-voltage characteristic is almost solely a function of the distribution profile of the N-type impurities since the growth of the depletion region into the P-type conductivity region 25 is essentially negligible, this latter region being relatively thin and containing a high concentration of P-type dopant material as noted previously. Thus, since this curve is precisely controllable and predictable as a function of the ion implantation process, diodes manufactured according to this process will have readily reproducible electrical characteristics, i.e., voltage-capacitance characteristics. As was mentioned previously, the concentration of ions implanted at a given energy will follow an essentially gaussian distribution as a function of depth so that the concentration peaks at a predeterminable depth below the surface of the semiconductor material. By superimposing a series of such distribution curves or profiles which peak at different points due to the use of different acceleration energy levels, composite profiles of various shapes and characteristics may be obtained. Since the use of the ion implantation process thus permits the shape of the dopant concentration profile to be arbitrarily varied over a considerable range, the capacitance-voltage characteristic of the resultant diodes may likewise be tailored or adjusted over a considerable range, the effect of a given distribution on the capacitance characteristic being calculable. Thus, to considerable extent, the electrical characteristics of diodes constructed according to the present invention may be adjusted to suit the needs of the circuit designer, rather than have the circuit designer alter his design parameters to fit the characteristics of available diodes. In addition, the ion implantation process may be more precisely controlled than typical diffusion processes so the method of the invention provides diodes with reproducible characteristics.

Further, since the epitaxial growth process, particularly using the silane source atmosphere as described previously, provides a layer which is of precisely predeterminable thickness with a relatively sharply defined transition between the relatively low conductivity of the original epitaxial material and the high-conductivity substrate, there is no need to provide a low-conductivity region of exceptionally great depth in order to have reproducible doping in the epitaxial layer at the maximum depletion depth. Thus, since the Q of the device is a function of the thickness of the low-conductivity region not occupied by the depletion region, it will be understood that this method of construction provides devices having relatively high Q's as compared with those in which there is a region of low-conductivity material which extends for a considerable depth below he diode junction.

Diodes constructed in accordance with the method described above by way of example are suitable for use in VHF television tuners. Typical capacitance figures for a unit having an active area of $5.5\times10^{-4}$ cm.$^2$ are:

20 pf. at 4 volts
10 pf. at 8 volts
3.5 pf. at 20 volts

The Q of devices so constructed is typically better than 250 at 50 MHz with the device capacitance adjusted to 11 pf. Further, devices from the same lot will typically track one another to better than ±(3% 0.1 pf.).

In view of the foregoing, it may be seen that several objects of the present invention are achieved and other advantageous results have been attained.

As various changes could be made in the above methods and constructions without departing from the scope of the invention, it should be understood that all matter contained in the above description or shown in the accompanying drawings shall be interpreted as illustrative and not in a limiting sense.

What is claimed is:

1. The method of making a diode, the capacitance of which is voltage variable, said method comprising:

providing a semiconductor substrate which is relatively highly doped to provide conductivity of a first type;

epitaxially growing on said substrate a semiconductor layer which is relatively lightly doped to provide conductivity of said first type, there being a relatively sharply defined transition in conductivity between said epitaxial layer and the original substrate material;

diffusing into a relatively shallow portion of said epitaxial layer a relatively high concentration of a dopant providing conductivity of a second type, complementary to said first type;

implanting into said layer, through and beyond said shallow portion thereof, ions of a dopant material providing conductivity of said first type, thereby to provide a conductivity profile which decreases with depth through said layer away from the shallow portion thereof down to the level of the uniform epitaxial material, whereby, when said shallow portion of second-type conductivity is reverse biased with respect to said substrate and the balance of said epitaxial layer, the thickness of the depletion region and the capacitance of the diode vary as precisely predictable functions of said conductivity profile.

2. The method of making a diode as set forth in claim 1 wherein said semiconductor substrate and said epitaxial layer grown thereupon are essentially silicon.

3. The method of making a diode as set forth in claim 2 wherein said substrate is doped with antimony.

4. The method of making a diode as set forth in claim 2 wherein said epitaxial layer is doped with phosphorous.

5. The method of making a diode as set forth in claim 2 wherein said dopant providing second-type conductivity is boron.

6. The method of making a diode, the capacitance of which is voltage variable, said method comprising:

providing a silicon substrate which is relatively highly doped to provide conductivity of a first type;

epitaxially growing on said substrate, by reducing a silane atmosphere, a silicon layer which is relatively lightly doped to provide conductivity of said first type, there being a relatively sharply defined transition in conductivity between said epitaxial layer and the original substrate material;

diffusing into a relatively shallow portion of said epitaxial layer, from a boron-doped glass deposit, a relatively high concentration of a dopant providing conductivity of a second type, complementary to said first type;

implanting into said layer, through and beyond said shallow portion thereof, ions of a dopant material providing conductivity of said first type, the energy level at which the ions are implanted being selected to provide a peak concentration approximately coincident with the edge of said shallow portion of second-type conductivity, whereby, when said shallow portion of second-type conductivity is reverse biased with respect to said substrate and the balance of said epitaxial layer, the thickness of the depletion region and the capacitance of the diode vary as precisely predictable functions of the conductivity profile provided by said implantation.

7. The method of making a diode, the capacitance of which is voltage variable, said method comprising:

providing a silicon substrate which is relatively highly doped to provide N-type conductivity;

epitaxially growing on said substrate, by reducing a silane atmosphere, a silicon layer which is relatively lightly doped to provide N-type conductivity, there being a relatively sharply defined transition in conductivity between said epitaxial layer and the original substrate material;

diffusing into a relatively shallow portion of said epitaxial layer, from a boron-doped glass deposit, a relatively high concentration of a boron to provide P-type conductivity;

implanting into said layer, through and beyond said shallow portion thereof, ions of phosphorous to provide increased N-type conductivity, the energy level at which the ions are implanted being selected to provide a peak concentration approximately coincident with the edge of said shallow portion of P-type conductivity, whereby, when said shallow portion of P-type conductivity is reverse biased with respect to said substrate and the balance of said epitaxial layer, the thickness of the depletion region and the capacitance of the diode vary as precisely predictable functions of the conductivity profile provided by said implantation.

8. A semiconductor diode having a voltage variable capacitance characteristic, said diode comprising:

a substrate relatively highly doped to provide a first conductivity type;

on said substrate, and epitaxial layer of said first conductivity type having doping material which is relatively light relative to the doping of said substrate, the first conductivity type doping material in said layer following a distribution profile which increases from the surface for a distance below the surface and decreases beoynd said distance through said layer substantially down to the level of the epitaxial material, said epitaxial layer having a relatively shallow heavy doping of a second conductivity type doping material adjacent its surface, the depth of the second conductivity type doping material being approximately equal to said distance whereby, when said shallow portion of said layer is reverse biased with respect to said substrate and the balance of said layer, the thickness of the depletion region and the capacitance of the diode vary as precisely predictable functions of said conductivity profile.

9. A semiconductor diode having a voltage variable capacitance characteristic, said diode comprising:

a substrate relatively highly doped to provide a first conductivity type;

on said substrate a relatively lightly doped first conductivity type epitaxial layer adjacent said substrate and providing a relatively sharply defined transition in conductivity between said epitaxial layer and the substrate material, a relatively shallow portion of said epitaxial layer being of second conductivity type with a relatively high concentration of doping material; and implanted into said layer, through and beyond said shallow portion thereof, ions of a dopant material providing conductivity of said first type, said implanted ions providing a conductivity profile which decreases with depth through said layer for a distance beyond said shallow portion whereby, when said shallow portion of second-type conductivity is reverse biased with respect to said substrate and the balance of said epitaxial layer, the thickness of the depletion region and the capacitance of the diode vary as precisely predicatble functions of said conductivity profile.

10. A semiconductor diode having a voltage variable capacitance characteristic, said diode comprising:

a silicon substrate relatively highly doped to provide N-type conductivity;

on said substrate a relatively lightly doped N-type conductivity epitaxial layer of silicon adjacent said substrate providing a relatively sharply defined transition in conductivity between said epitaxial layer and the substrate material, a relatively shallow portion of said epitaxial layer being of P-type conductivity provided by a relatively high concentration of boron dopant; and implanted into said layer, through and beyond said shallow portion thereof, phoshorous ions providing N-type conductivity, said implanted ions providing an N-type conductivity profile which reaches a maximum value approximately at the edge of said shallow portion, whereby, when said shallow portion of P-type conductivity is reverse biased with respect to said substrate and the balance of said epitaxial layer, the thickness of the depletion region and the capacitance of the diode vary as precisely predictable functions of the N-type conductivity profile provided by the implanted ions.

PO-1050
(5/69)

UNITED STATES PATENT OFFICE
CERTIFICATE OF CORRECTION

Patent No. 3,634,738 Dated January 11, 1972

Inventor(s) Frank A. Leith and Carl H. Guild, Jr.

It is certified that error appears in the above-identified patent and that said Letters Patent are hereby corrected as shown below:

Column 1, at the beginning of line 43, delete "epitaxial" and insert --the--; line 46, after "change" and before "total", "o" should be --to--.

Column 2, line 47, after "susceptor" change "of" to --or--; line 59, after "layer 13", "if" should be --is--.

Column 3, line 3, after "concentration", "is" should be --in--.

Column 4, line 50, after "below", "he" should be --the--; and on line 61, "± (3% 0.1 pf.)" should be --± (3% + 0.1 pf)--.

Claim 8, column 6, line 13, "and" should be --an--.

Signed and sealed this 13th day of June 1972.

(SEAL)
Attest:

EDWARD M.FLETCHER,JR.
Attesting Officer

ROBERT GOTTSCHALK
Commissioner of Patents